(12) United States Patent
Thallner

(10) Patent No.: US 8,875,766 B2
(45) Date of Patent: Nov. 4, 2014

(54) DEVICE AND METHOD FOR THE APPLICATION OF A SHEET-LIKE JOINTING MEANS ONTO A CONTACT AREA OF A WAFER

(71) Applicant: Erich Thallner, St. Florian (AT)

(72) Inventor: Erich Thallner, St. Florian (AT)

( * ) Notice: Subject to any disclaimer, the term of this patent is extended or adjusted under 35 U.S.C. 154(b) by 0 days.

(21) Appl. No.: 13/947,141

(22) Filed: Jul. 22, 2013

(65) Prior Publication Data

US 2013/0306242 A1 Nov. 21, 2013

Related U.S. Application Data

(62) Division of application No. 11/078,136, filed on Mar. 11, 2005, now Pat. No. 8,500,930.

(30) Foreign Application Priority Data

Mar. 12, 2004 (DE) .......................... 10 2004 012 618

(51) Int. Cl.
*B32B 41/00* (2006.01)
*B32B 37/10* (2006.01)
*B32B 38/18* (2006.01)
*H01L 21/67* (2006.01)
*B32B 37/00* (2006.01)

(52) U.S. Cl.
CPC ...... *B32B 37/0046* (2013.01); *H01L 21/67132* (2013.01); *B32B 41/00* (2013.01)

USPC .......... 156/361; 156/362; 156/367; 156/378; 156/379

(58) Field of Classification Search
CPC B32B 37/0046; B32B 37/10; B32B 38/0004; B32B 38/04; B32B 38/1833; B32B 38/185; B32B 41/00; B32B 41/10; B32B 41/02; H01L 24/50
USPC ........... 156/64, 234, 235, 238, 361, 362, 378, 156/379, 367
See application file for complete search history.

(56) References Cited

U.S. PATENT DOCUMENTS

| | | | |
|---|---|---|---|
| 5,106,450 A | 4/1992 | Freisitzer et al. | 156/517 |
| 5,217,550 A * | 6/1993 | Takeuchi et al. | 156/64 |
| 5,328,546 A | 7/1994 | Brady et al. | 156/584 |
| 2002/0114123 A1 | 8/2002 | Nishio et al. | 361/234 |
| 2003/0101930 A1 | 6/2003 | Sohn et al. | 118/300 |
| 2004/0221871 A1 | 11/2004 | Fletcher et al. | 134/6 |

FOREIGN PATENT DOCUMENTS

| | | | | |
|---|---|---|---|---|
| AT | 405775 | 1/1998 | | H01L 21/68 |
| DE | 10048881 | 9/2000 | | H01L 21/58 |
| EP | 1278245 | 1/2003 | | H01L 27/12 |
| EP | 1381076 A2 | 1/2004 | | H01L 21/00 |
| JP | 63165271 A | 7/1988 | | B65H 37/04 |
| JP | 2004-025438 | 1/2004 | | B26D 3/00 |
| JP | 2004047976 A | 2/2004 | | H01L 21/304 |

* cited by examiner

*Primary Examiner* — George Koch
(74) *Attorney, Agent, or Firm* — Kusner & Jaffe

(57) ABSTRACT

The invention concerns a device and a corresponding method for the jointing of wafers along their corresponding surfaces.

10 Claims, 4 Drawing Sheets

DEVICE AND METHOD FOR THE APPLICATION OF A SHEET-LIKE JOINTING MEANS ONTO A CONTACT AREA OF A WAFER

RELATED APPLICATIONS

This application is a divisional of U.S. application Ser. No. 11/078,136, filed Mar. 11, 2005, now U.S. Pat. No. 8,500,930, which claims priority from German Patent Application No. 10 2004 012 618.6, filed Mar. 12, 2004, said patent applications hereby fully incorporated herein by reference.

FIELD OF THE INVENTION

The invention relates to a device and a method for the application of a sheet-like jointing means onto a contact area of a wafer.

BACKGROUND OF THE INVENTION

The methods described in the prior art for the application of sheet-like jointing means onto a contact area of a wafer essentially take place as follows.

The sheet-like jointing means are usually multi-layer films with a middle layer, which provides for the jointing of the carrier wafer with the product wafer. Protective films are arranged above and below this middle layer, in order that the multi-layer films can be used in a space-saving manner during delivery and processing and the middle layer does not become jointed to itself and consequently could no longer be unrolled. These protective films also have the purpose of preventing contamination of the middle film.

With the generic methods, the multi-layer film is first guided to the carrier wafer. Along this path, the lower protective film is removed in order that the middle layer, also referred to as the adhesive film, can be brought into contact with the wafer. The carrier wafer—also referred to as the handling wafer—is made from very hard material, e.g. sapphire. Once the film has been brought onto the carrier wafer, a blade is used to cut along the edge of the carrier wafer, so that the carrier wafer and the film, now consisting solely of the middle layer and upper layer, are jointed without overlapping portions.

The carrier wafer thus obtained with the applied film is then introduced for further processing into known bonding systems, in which the upper protective layer is removed and the product wafer is bonded with the carrier wafer.

The critical point in the methods previously described in the prior art is the cutting of the sheet-like jointing means along the edge of the very hard carrier wafer. If a blade is used for this, the latter already has to be replaced after a few passes, because it is blunt. This thus causes high material wear and downtimes with the equipment.

If, on the other hand, a laser beam is used for cutting the film along the edge, the latter produces at the cutting edge a projecting border or bead, which subsequently hinders precise bonding.

When cutting along the edge, moreover, as soon as the blade has been conveyed once around the wafer, film stripes arise with inaccurate cutting, which then hang out from the wafer face during further processing and can even get onto the wafer surface.

SUMMARY OF THE INVENTION

The object of the present invention is to provide a method and a device, with which wafers can be provided with an adhesive film in a low-cost manner without the possibility of strip formation.

The basic idea of the invention is to adapt the sheet-like jointing means (multi-layer film) beforehand to the shape and size of the contact area of the carrier wafer and then to produce the contact between the jointing means and the wafer.

Insofar as mention is made of wafer in connection with the invention, this stands vicariously for any kind of sheet-like component that has to make contact in a precise manner with a sheet-like jointing element.

The object mentioned is solved by a device for the application of a sheet-like jointing element onto a contact area of a wafer, which has the following features:

a. a first device for receiving and, as necessary, moving the sheet-like jointing element
b. a second device for receiving and, as necessary, moving the wafer
c. alignment means
d. a control unit which brings about the following work steps after one another:
  i. alignment of the contact area of the sheet-like jointing means with the contact area of the wafer by means of the alignment means, the first device and the second device, whereby the size of the sheet-like jointing element essentially corresponds to the size of the contact area of the wafer.
  ii. bringing the contact area of the sheet-like jointing means into contact with the contact area of the wafer.

The first device can be a chuck which receives the sheet-like jointing element, for example by means of suction, and can freely move and rotate the latter in the device.

The second device can also be one such chuck or a similar chuck, on which the carrier wafer lies. This chuck can be made of glass or another transparent material, in order that the alignment means can determine, through the latter, the position of the wafer on the second device and can be arranged beneath the latter. Equally, however, the chuck can also be constituted by a non-transparent material and the position of the wafer determined in another way.

The sheet-like jointing means is first aligned by means of alignment means with the contact area of the wafer, whereby the sheet-like jointing means already has the surface dimensions of the wafer. It may even be sensible to form the jointing means a very small amount, for example 100 µm, smaller in diameter, so that the carrier wafer is subsequently contacted first with an edge contact. The horizontal alignment of the sheet-like jointing means precisely over the wafer also lying horizontal on the second device is sensible.

The first device is then lowered, as a result of which the contact area of the jointing means lying precisely over the contact area of the carrier wafer is brought into contact with the latter.

In this way, a device is created which manages without a blade that has to cut the jointing means along the wafer, as a result of which it follows that an interruption in production to replace the blade is not necessary during preparation of the wafer for the bonding process. Furthermore, it can no longer happen that strips, which arise when cutting along the wafer in the prior art, hinder the subsequent processing of the wafer or cause waste.

Optical detection means, which detect the position of the sheet-like jointing element and the wafer in a contactless manner and comprise at least one, but preferably three, detection devices, ensure the exact alignment of the sheet-like jointing means with respect to the wafer or vice versa, in that they detect the relative position of the jointing means with respect to the wafer and relay this to the control unit, which then effects an alignment of the wafer precisely beneath the sheet-like jointing element.

The optical detection devices can be designed as microscopes, by means of which a micrometer-precise alignment and subsequent contacting of the sheet-like jointing means with the carrier wafer can be achieved, without wear and waste products inside the device having to be transported away. The contamination of the usually sterile interior of the device is reduced to a minimum.

For the alignment of the wafer and the sheet-like jointing element, use is made of mechanical means which rotate and/or displace the respective wafer as soon as corresponding signals are received from the control unit.

The aforementioned problem is also solved by an accompanying method for the application of a sheet-like jointing element onto a contact area of a wafer, wherein the sheet-like jointing element is first brought essentially to the size of the contact area of the wafer and the contact areas are then aligned with one another and brought into contact by means of a first device for receiving and, as necessary, moving the sheet-like jointing element and a second device for receiving and, as necessary, moving the wafer and alignment means, whereby the course of the method is controlled by a control unit which is connected via active connections to the first and second device and to the alignment means.

A constituent part of the method according to the invention is the matching of the size of the jointing means to the size of the contact area of the wafer. This can take place both inside the device described above with the aid of a punching device. Several pieces of film can also be punched simultaneously from an unwinding multi-layer film by means of this punching device. The advantage of punching-out consists in the fact that the wear is less compared with cutting and the punching-out can take place much more rapidly. Various sizes of wafers can be catered for by means of different stamping punches.

The sheet-like jointing means can, however, also be purchased already pre-punched and introduced in this form into the device. This is also to be assumed within the wording of the method.

With regard to further forms of embodiment in respect of the individual process steps, reference is made to the above explanations in connection with the device and to the following description of the figures.

Further features of the invention will emerge from the features of the sub-claims as well as the other application documents.

The invention will be explained in greater detail below with the aid of an example of embodiment. The features described therein may be of importance for the implementation of the invention both individually as well as in any combinations. This also applies to the features that have been mentioned above to describe the device and the method.

BRIEF DESCRIPTION OF THE DRAWINGS

The figures in the drawing show the following in detail.

DETAILED DESCRIPTION OF THE INVENTION

Figure 1:
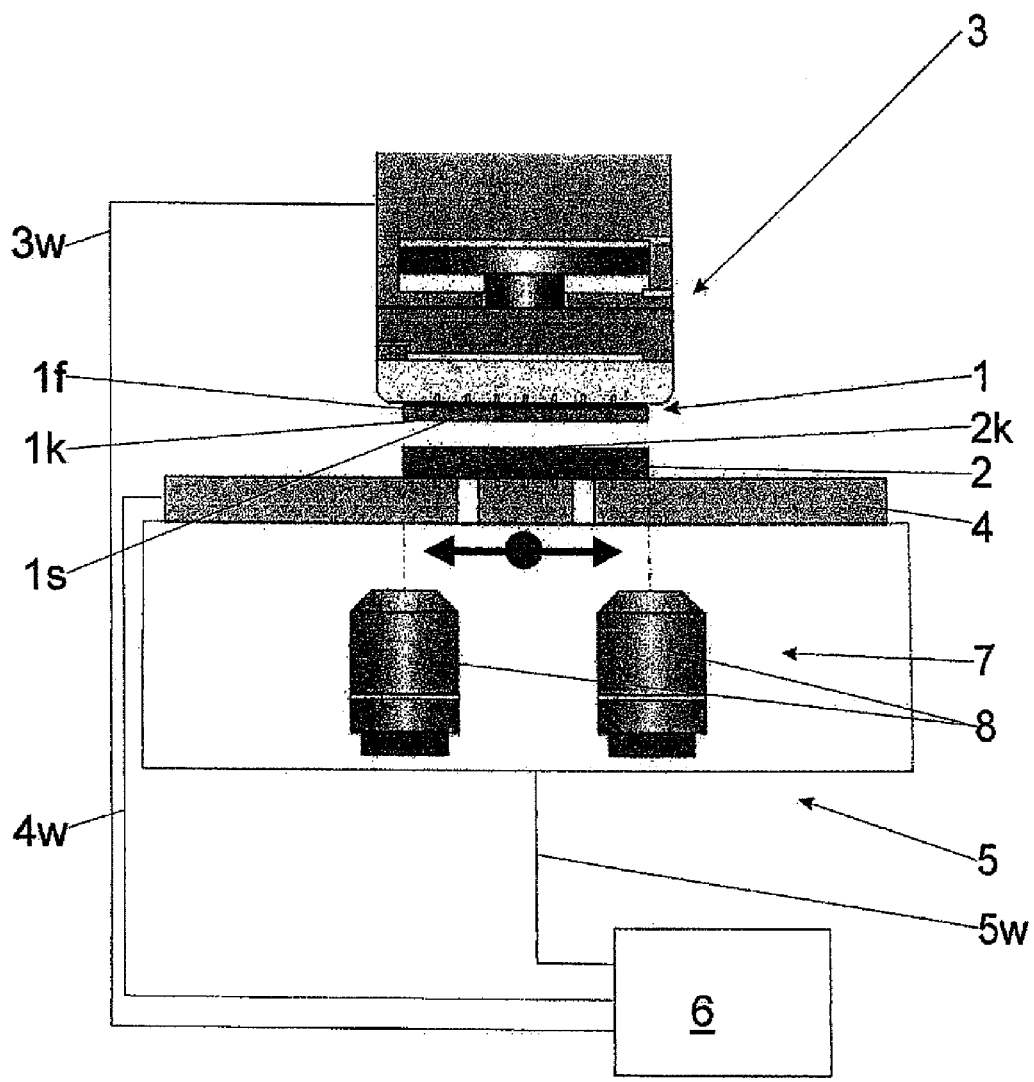
FIG. 1 a diagrammatic view of the device according to the invention
FIG. 2 a diagrammatic view of the device according to the invention with expansion units
FIG. 3 a diagrammatic side view of the device according to the invention with expansion units
FIG. 4 a diagrammatic view of a preparation step.

FIG. 1 shows—very schematised—a control unit 6, which effects the performance of the method according to the process steps described in the above description in an exemplary configuration of the present invention.

Control device 6 is connected here by means of a first, second and third connection $3w$, $4w$ and $5w$ respectively to a first device 3 for receiving and, as necessary, moving a sheet-like jointing element 1, a second device 4 for receiving and, as necessary, moving a wafer 2, and alignment means 5.

First device 3 and second device 4 are able, respectively, to move sheet-like jointing element 1 and wafer 2 with precision arbitrarily within the device. Movement is intended to mean traversing in all spatial directions as well as a rotation. The spatial arrangement of the devices with respect to one another is merely by way of example. One of the two devices 3 or 4 can be designed rigid in a simplified form of embodiment.

The receiving of wafer 2 on second device 4 and the receiving of sheet-like jointing element 1 on first device 3 takes place in a manner known in the prior art, here by means of a Bernoulli connection.

Sheet-like jointing element 1 is a multi-layer film here, which comprises an upper and lower protective film $1s$ and a middle jointing film $1f$, which is in separable contact with the protective film in each case with a contact area $1k$ above and below. Lower contact area $1k$ serves here for the jointing with the (carrier) wafer 2. Upper contact area $1k$ serves for the subsequent jointing of sheet-like jointing element 1, jointed with carrier wafer 2, with a product wafer in the bonding. (not shown here).

Arranged beneath second device 4 are alignment means 5, which serve for the alignment of carrier wafer 2 with respect to sheet-like jointing means 1. The geometrical arrangement of alignment means 5 inside the device is however to be regarded merely by way of example.

Optical detection means 7 serve both to detect the position of sheet-like jointing element 1 and to detect the position of wafer 2 and have two detection devices 8, two microscopes here. There can of course also be assigned to sheet-like jointing element 1 and to wafer 2 their own detection devices 8 for detecting the position. Second device 4 is transparent in the present configuration of the invention, so that a detection of the position of wafer 2 is possible from beneath. This can be seen by the dot-dashed line, which represents diagrammatically the detection beam.

Figure 2:
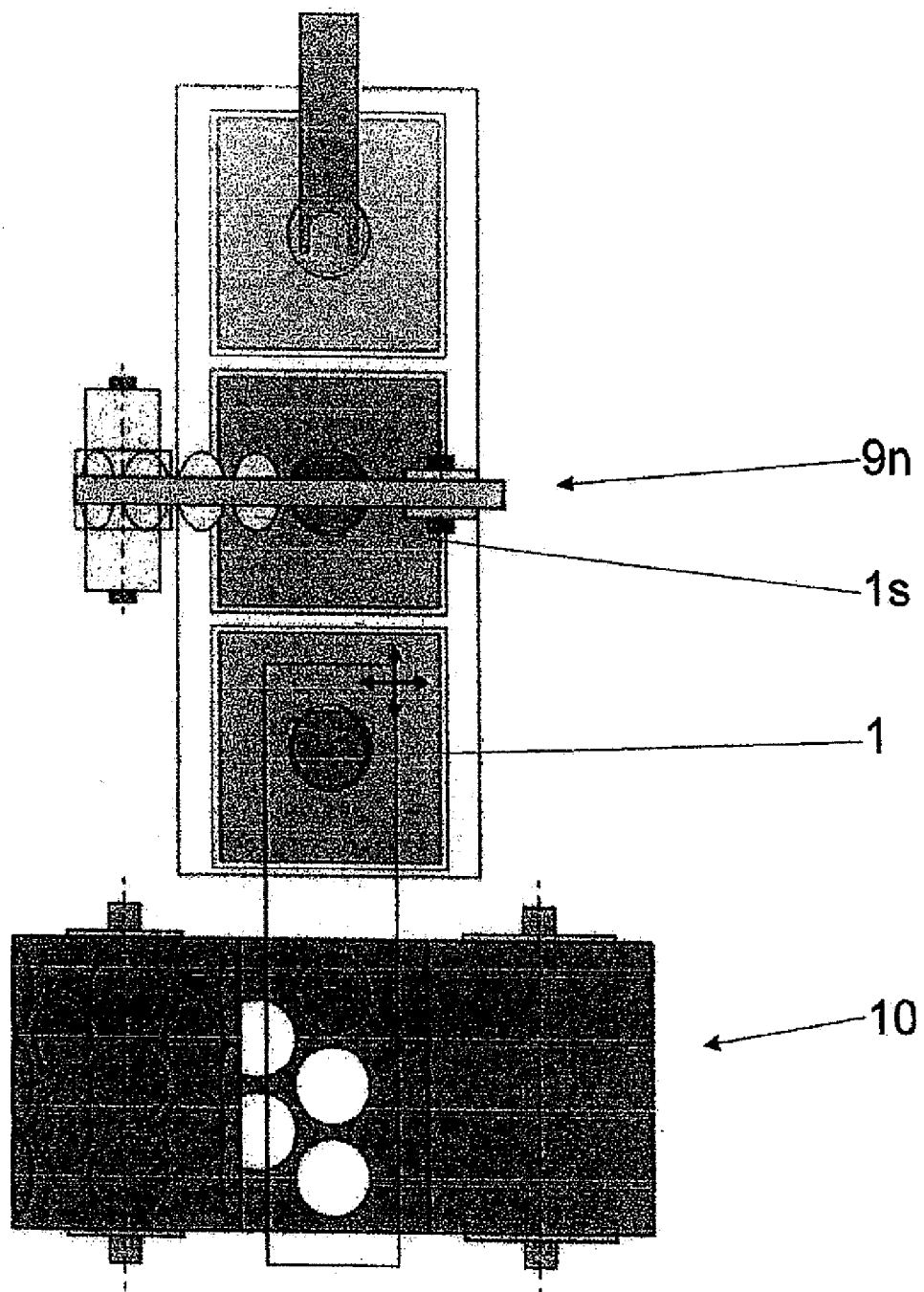
Figure 3:
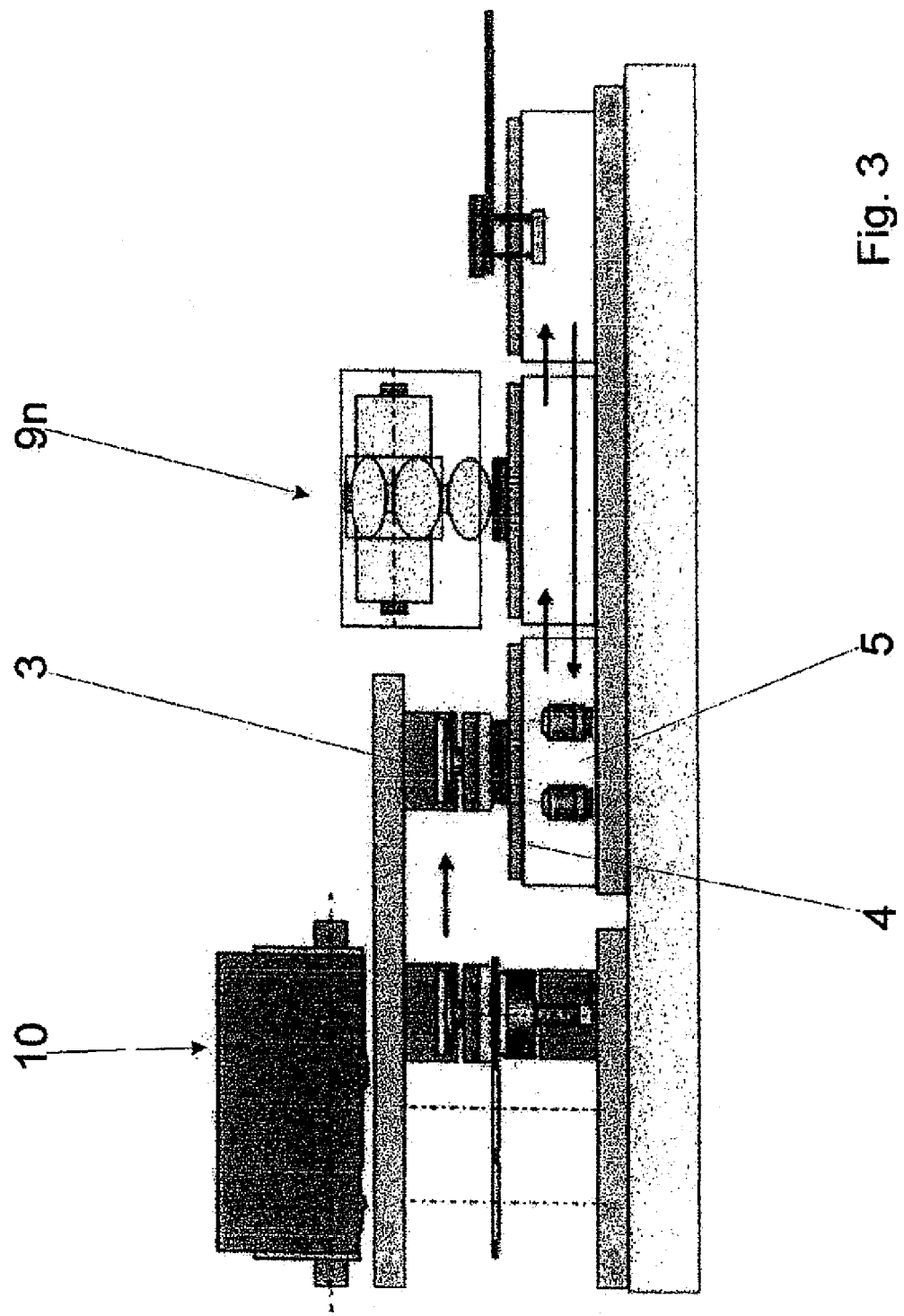
Figure 4:
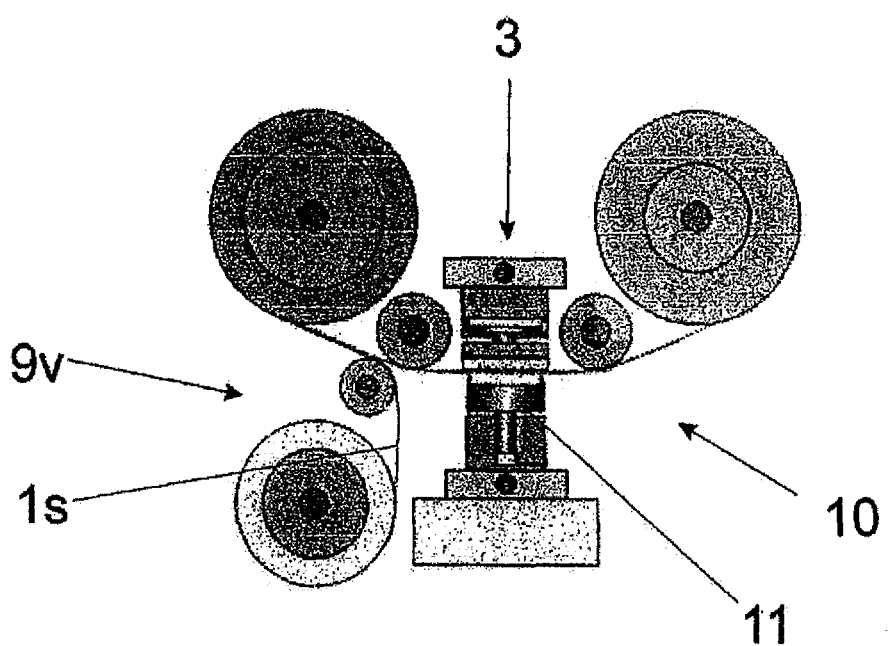

FIG. 2, moreover, shows a punching device 10 for punching out sheet-like jointing element 1. The sheet-like jointing elements are punched out with the punching device from a multi-layer film, which is delivered as a roll, and are then fed to the device represented in FIG. 1. A diagrammatic sectional side view of the punching device is shown in FIG. 4. First device 3 for receiving and, as necessary, moving sheet-like jointing element 1 is aligned over the multi-layer film and a stamping punch 11 of punching device 10 and lowered down to the protective film.

Sheet-like jointing element 1, which essentially corresponds in size, i.e. the surface area, to contact area $2k$ of wafer 2, is then punched out. No strips at the edge of sheet-like jointing element 1 can be formed due to the punching-out, as often occurs with the conventional cutting of sheet-like jointing element 1 along the edge of wafer 2. The device according to the invention also operates, of course, with already pre-punched or already punched-out sheet-like jointing means 1. The punching-out process just described is then partially or wholly dispensed with.

Lower protective film $1s$ of sheet-like jointing element 1 is pulled off by means of a film pull-off device $9v$.

Stamping punch 11 of punching device 10 is lowered again and first device 3 is moved together with sheet-like jointing element 1 into a position over alignment means 5, where the following alignment process begins. The exact position of sheet-like jointing element 1 is detected and stored, which takes place either in storage means in alignment means 5 or in storage means in control unit 6. The data can in each case be transmitted via connections 3*w*, 4*w* and 5*w*.

The edge of sheet-like jointing means 1 and of wafer 2 respectively serves in the present case to detect the position, said edge being detected and processed by means of image recognition. The detection can also take place by means of adjustment marks made on sheet-like jointing means 1 and/or wafer 2, by means of which adjustment marks the precise position can be calculated.

After the position has been stored, carrier wafer 2 is conveyed between sheet-like jointing means 1 and alignment means 5, whereby contact areas 1*k* and 2*k* lie opposite one another. Wafer 2 is now moved into exactly the same position under the sheet-like jointing element, whereby it also involves the same rotation alignment. The wafer is aligned with the sheet-like jointing means here with the aid of a flattening of the otherwise rotation-symmetric body.

As soon as the correct position is reached, contact areas 1*k* and 2*k* are brought into contact. Contact area 1*k* of the sheet-like jointing means is slightly smaller in the present configuration of the invention, so that the edge of the carrier wafer subsequently projects outwards slightly in the finish-bonded wafer. Contact areas 1*k* and 2*k* are brought into contact precisely at the centre of gravity of the areas, so that a uniform step arises at the circumference.

First device 3 is then separated from sheet-like jointing element 1 and sheet-like jointing element 1 together with carrier wafer 2 undergoes further process steps. In the subsequent process, upper protective film 1*s* still remaining on sheet-like jointing element 1 is then removed by means of film removal means 9*n*, in order that sheet-like jointing element 1 can be conveyed together with carrier wafer 2 for bonding with a product wafer.

As a result of the invention thus configured, the punching, lamination and removal of the protective film from the multi-layer film is carried out in one device. In addition, the high degree of wear on the blades during the cutting of the multi-layer film along the hard carrier-wafer edge is no longer present. Stamping punches 11 can easily be replaced by others, and this enables the use of a large number of shapes and sizes of wafers 2 and sheet-like jointing elements 1. Furthermore, no waste or comparatively little waste is produced inside the device.

Having described the invention, the following is claimed:

1. A device for the application of a sheet-like jointing element onto a contact area of a wafer with the following features:
    a first holding device having a surface for receiving the sheet-like jointing element thereon;
    a second holding device having a surface for receiving the wafer thereon, wherein the surface of the first holding device and the surface of the second holding device are movable relative to each other;
    a single detection device that detects the position of a contact area of the wafer at a predetermined location and an outer peripheral edge of the sheet-like jointing element at the predetermined location;
    a control unit connected to the first holding device, the second holding device and the single detection device, the control unit programmed to provide commands to the first holding device, the second holding device and the single detection device:
        to align the contact area of the sheet-like jointing element with the contact area of the wafer, whereby the size of the contact area of the sheet-like jointing element essentially corresponds to the size of the contact area of the wafer, and
        to bring the contact area of the sheet-like jointing element into contact with the contact area of the wafer.

2. The device according to claim 1, wherein the single detection device is an optical detection device which detects the positions of the sheet-like jointing element and the wafer.

3. The device according to claim 2, whereby the optical detection device is a microscope.

4. The device according to claim 1, wherein the control unit includes a data storage device connected to the first and second holding devices and the single detection device and the control unit is programmed such that:
    the sheet-like jointing element is moved by the first holding device into a position over the single detection device, whereby the contact area of the sheet-like jointing element is arranged in the direction of the single detection device;
    the position of the sheet-like jointing element is stored in the data storage device of the control unit; and
    the wafer is moved by the second holding device into a position between the sheet-like jointing element and the single detection device, whereby the contact area of the wafer is arranged in the direction of the contact area of the sheet-like jointing element and parallel to the contact area of the sheet-like jointing element, and whereby the contact areas are arranged precisely opposite one another.

5. The device according to claim 1, wherein the contact area of the sheet-like jointing element is smaller than or equal to the contact area of the wafer.

6. The device according to claim 1, further comprising a punch device to punch out the sheet-like jointing element to the appropriate size.

7. The device according to claim 6, wherein the punch device includes a film removal device to remove a protective film from the sheet-like jointing element prior to a punching-out step.

8. The device according to claim 1, wherein the sheet-like jointing element is a jointing film with two contact areas, whereby each contact area is covered by a protective film, and whereby a film removal device is provided, which removes the protective film from the sheet-like jointing element prior to the contact area of the sheet-like jointing element coming into contact with a corresponding contact area of the wafer.

9. The device according to claim 1, wherein the control unit includes a data storage device connected to the first and second holding devices to store the positions of the sheet-like jointing element and of the wafer.

10. The device according to claim 1, wherein the single detection device detects the position of the outer peripheral edge of the sheet-like jointing element relative to the contact area of the wafer.

* * * * *